(12) United States Patent
Faul

(10) Patent No.: US 11,521,919 B2
(45) Date of Patent: Dec. 6, 2022

(54) FLEX-FOIL PACKAGE WITH COPLANAR TOPOLOGY FOR HIGH-FREQUENCY SIGNALS

(71) Applicant: Fraunhofer-Gesellschaft zur Foerderung der angewandten Forschung e.V., Munich (DE)

(72) Inventor: Robert Faul, Hansastrasse (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/803,072

(22) Filed: Feb. 27, 2020

(65) Prior Publication Data

US 2020/0279797 A1 Sep. 3, 2020

(30) Foreign Application Priority Data

Feb. 28, 2019 (DE) ...................... 10 2019 202 716.4

(51) Int. Cl.
*H01L 23/495* (2006.01)
*H01L 23/31* (2006.01)
(Continued)

(52) U.S. Cl.
CPC ...... *H01L 23/49572* (2013.01); *H01L 21/563* (2013.01); *H01L 23/3107* (2013.01);
(Continued)

(58) Field of Classification Search
CPC .......... H01L 23/49572; H01L 23/3107; H01L 23/4951; H01L 23/66
See application file for complete search history.

(56) References Cited

U.S. PATENT DOCUMENTS 5,956,232 A 9/1999 Zakel et al.
6,154,366 A 11/2000 Ma et al.
(Continued)

FOREIGN PATENT DOCUMENTS

DE 19500655 B4 7/1996
DE 19542883 C2 8/1996
(Continued)

OTHER PUBLICATIONS

English Machine Translation of WO2018173750, Antenna Module and Communication Device; Asaka Atsushi, published Sep. 27, 2018.*

(Continued)

*Primary Examiner* — Peniel M Gumedzoe
(74) *Attorney, Agent, or Firm* — Perkins Coie LLP; Michael A. Glenn

(57) ABSTRACT

The invention relates to a foil-based package with at least one foil substrate having an electrically conductive layer arranged thereon which is patterned to provide a first electrically conducting portion and a second electrically conducting portion, which is coplanar to the first electrically conducting portion, and a third electrically conducting portion, which is coplanar to the first electrically conducting portion, the first electrically conducting portion being arranged between the second and third electrically conducting portions. In accordance with the invention, the first electrically conducting portion is implemented to be a signal-guiding waveguide for high-frequency signals and the second electrically conducting portion, which is coplanar to the first electrically conducting portion, and the third electrically conducting portion, which is coplanar to the first electrically conducting portion, form an equipotential surface.

15 Claims, 8 Drawing Sheets

(51) Int. Cl.
*H01L 23/66* (2006.01)
*H01L 21/56* (2006.01)

(52) U.S. Cl.
CPC .......... *H01L 23/4951* (2013.01); *H01L 23/66* (2013.01); *H01L 2223/6627* (2013.01)

(56) References Cited

U.S. PATENT DOCUMENTS

| | | |
|---|---|---|
| 8,563,358 B2 | 10/2013 | Landesberger et al. |
| 9,018,742 B2 | 4/2015 | Nikitin et al. |
| 9,692,009 B2 | 6/2017 | Lang et al. |
| 2001/0019179 A1 | 9/2001 | Yoshino et al. |
| 2002/0121707 A1 | 9/2002 | Pendse et al. |
| 2003/0035275 A1 | 2/2003 | Kopf |
| 2003/0057525 A1 | 3/2003 | Fock et al. |
| 2004/0119166 A1 | 6/2004 | Sunohara |
| 2004/0232528 A1 | 11/2004 | Ito et al. |
| 2005/0087847 A1 | 4/2005 | Kuan et al. |
| 2005/0127503 A1 | 6/2005 | Gobl et al. |
| 2007/0267740 A1 | 11/2007 | Khan et al. |
| 2008/0244902 A1 | 10/2008 | Blackwell et al. |
| 2009/0096083 A1 | 4/2009 | Augustin et al. |
| 2011/0133341 A1 | 6/2011 | Shimizu et al. |
| 2012/0091594 A1 | 4/2012 | Landesberger et al. |
| 2012/0168920 A1 | 7/2012 | Tan et al. |
| 2013/0187259 A1 | 7/2013 | Nikitin et al. |
| 2014/0008777 A1 | 1/2014 | Loh et al. |
| 2015/0207101 A1 | 7/2015 | Lang et al. |
| 2015/0221842 A1 | 8/2015 | Mima et al. |
| 2015/0294931 A1 | 10/2015 | Brucchi et al. |
| 2017/0125881 A1 | 5/2017 | Mangrum et al. |
| 2017/0207524 A1* | 7/2017 | Cardinali ................. H01Q 9/42 |
| 2017/0236776 A1* | 8/2017 | Huynh ................. H01Q 21/061 |
| | | 257/428 |
| 2018/0108616 A1 | 4/2018 | Chiang et al. |
| 2018/0300597 A1* | 10/2018 | Ng ................... G06K 19/07722 |
| 2020/0014113 A1* | 1/2020 | Asaka ................. H01Q 9/0407 |
| 2020/0279801 A1 | 9/2020 | Yacoub-George et al. |
| 2021/0159302 A1 | 5/2021 | Choi et al. |

FOREIGN PATENT DOCUMENTS

| | | |
|---|---|---|
| DE | 102010042567 B3 | 3/2012 |
| DE | 102013100339 A1 | 7/2013 |
| DE | 102012214411 A1 | 2/2014 |
| DE | 102014208958 A1 | 11/2015 |
| EP | 0920056 A2 | 6/1999 |
| EP | 1028463 A1 | 8/2000 |
| EP | 1256983 A2 | 11/2002 |
| EP | 1895585 A2 | 3/2008 |
| EP | 2040295 A2 | 3/2009 |
| EP | 2268110 A1 | 12/2010 |
| EP | 1548829 B1 | 10/2011 |
| JP | H0770681 B2 | 7/1995 |
| JP | H09148484 A | 6/1997 |
| JP | 2001291893 A | 10/2001 |
| WO | 2015173031 A1 | 11/2015 |
| WO | 2015173032 A1 | 11/2015 |

OTHER PUBLICATIONS

"JEDEC Standard MO-220".
"Quad Flat No-leads package", printout of https://de.wikipedia.org/wiki/Quad_Flat_No_Leads_Package (engl. version).

* cited by examiner

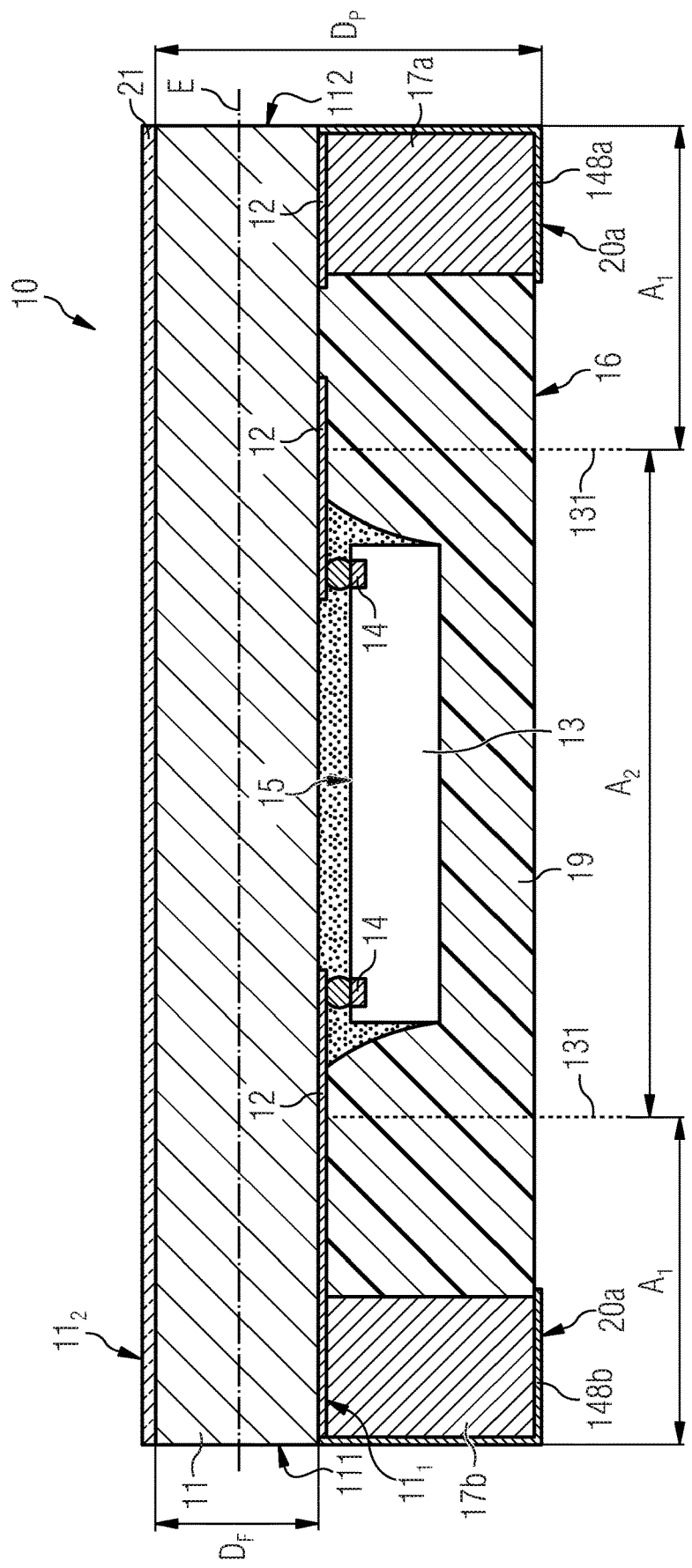

FLEX-FOIL PACKAGE WITH COPLANAR TOPOLOGY FOR HIGH-FREQUENCY SIGNALS

CROSS-REFERENCE TO RELATED APPLICATION

This application claims priority from German Application No. 10 2019 202 716.4, which was filed on Feb. 28, 2019, and is incorporated herein by reference in its entirety.

BACKGROUND OF THE INVENTION

The invention relates to a foil-based package for an electronic device or component and, in particular, to an ultra-thin flex-foil package with a topology in which electrically conducting portions are implemented as waveguides for high-frequency signals and arranged to be coplanar to one another.

A very high number of electronic devices having standardized packages are available on the market. SMD (Surface Mount Device) packages or QFN (Quad Flat No Leads) packages, for example, and numerous other standardized forms are among these, like CSP: Chip-Size Package and BGA: Ball Grid Array.

For respective housings or packages, for example, there are corresponding standardizations for defining the geometry of the package as regards width, length and height. Additionally, the geometries of the electrical contact pads (terminal pads) are defined, where the signal path passes from the system environment, like a printed circuit board, to an interior semiconductor device, like a chip, for example.

In order to ensure compatibility of the signal paths with equal functionalities of devices of equal standardization, but different manufacturers, the order and geometrical position of the terminal pads are to comply with the respective standardization definition.

QFN packages, for example, are well established on the market. For these packages for semiconductor chips, there are also embodiments with designations like TQFN (thin QFN), which are thinner than normal QFNs.

The lead frame topology is the common feature of these packages, which, in the case of dual-inline-type embodiments, for example, are arranged along two outer edges and, in the case of quad-type embodiments, along four outer edges of the package. The package thickness typically is in a range of 0.5 mm to 2.5 mm.

The evolution of these packages can be understood, when referring to the JEDEC M0220 standardization paper, using the parameters of I/O pad width ($\geq 200$ μm) and I/O pad distance ($\geq 200$ μm). A reason for this limit may be that the lead frames are punched parts and punch tools having geometries of below 200 μm are increasingly difficult to realize.

A second evolution in semiconductor devices (like chips) is for the number of IC (Integrated Circuit) contact pads to increase, partly up to more than several hundred pieces per chip, wherein the geometrical size of the IC pads and the distance between the IC pads decreases. The sum of the IC pad size and the distance therebetween is referred to as pad pitch.

In the case of advanced packages, the requirements imposed by industry and the market continuously reducing the size and, above all, the structural height of electronic assemblies and at the same time increasing their performance with decreasing costs are to be complied with.

Despite the miniaturizations strived for, one common feature of the standardized package forms mentioned before is that the package height frequently is more than 300 μm and that the package does not exhibit any appreciable flexibility.

Apart from that, the miniaturization of structures strived for in the evolution of semiconductor technology also allows increasing cutoff frequencies of the transistors, with the consequence that the signal bandwidth of the signals transmitted via the I/O pads of the chips in the respective system environment has reached the GHz range.

However, there is a conflict for the object in that the miniaturization of the package causes an adjustment of the pads and conductive trace structures so that the respective impedances are adjusted or matched to the desired high-frequency signal bandwidth. However, in conventional standardized package forms, this is not possible without restrictions due to the standardization specifications. In particular, in packages having a large number of I/O pads comprising a certain minimum size, the lengths of the outer edges of the package and the distances between the IC pads and the package pads increase. This results in wiring lengths where the so-called lambda/4 length is exceeded.

In particular for these cases, the inventive topology provides advantages for signal guiding with high-frequency signal bandwidth. Additionally, it would generally be desirable to provide a package or housing the package structural height of which is reduced to a level which has not been obtained so far using standardized packages (like SMD or QFN packages), and at the same time to improve the high-frequency signal bandwidths across I/O pads of the package.

Additionally, it would be desirable to provide a thin package so that the system substrate, including the package mounted thereon, exhibits certain flexibility or bending properties which is improved compared to what is achieved at present in systems having standardized packages (like SMD or QFN packages) on printed circuit boards. The term flexibility refers to changes in shape from a planar area towards a cylindrical curvature, but not a dome-shaped deformation. Cylindrical curvatures occur in the flexibility specifications of smart cards, for example.

In order to pursue the goal of ultra-thin packages (having overall thicknesses of <150 μm) and additionally approach requirements as to costs for manufacturing in competition with established packaging fabrications, what is desired are few process steps, an efficient ordering of process steps and materials causing reduced costs.

SUMMARY

According to an embodiment, a foil-based package may have: at least one foil substrate having an electrically conductive layer arranged thereon which is patterned to provide a first electrically conducting portion and a second electrically conducting portion, which is coplanar to the first electrically conducting portion, and a third electrically conducting portion, which is coplanar to the first electrically conducting portion, the first electrically conducting portion being arranged between the second and third electrically conducting portions, at least one electronic device having a device terminal side which has at least a first device terminal pad, wherein the at least one electronic device is mounted on the electrically conductive layer with no bond wire in flip-chip mounting technology so that the device terminal side of the electronic device is arranged opposite the electrically conductive layer, a plurality of package terminal pads arranged on a package terminal side and spaced apart laterally from the electronic device, for electrically contacting the package, wherein at least a first package terminal pad is in contact with the first electrically conducting portion so that the result is a signal path between the first package terminal pad and the first electrically conducting portion and the first device terminal pad, wherein the electronic device is electrically contactable from that side of the foil substrate facing the electronic device by means of the first package terminal pad, wherein the foil substrate has a first foil portion where the first package terminal pad is located, and wherein the foil substrate has a second foil portion where the electronic device is located, the first foil portion and the second foil portion extending along a common foil plane, and a casting compound arranged between the first foil portion and the second foil portion, wherein the casting compound encloses the plurality of package terminal pads and covers the at least one electronic device in order to separate the electronic device from the environment, wherein the first electrically conducting portion is implemented to be a signal-guiding waveguide for high-frequency signals, and wherein the second electrically conducting portion, which is coplanar to the first electrically conducting portion, and the third electrically conducting portion, which is coplanar to the first electrically conducting portion, form an equipotential surface.

According to another embodiment, a method for manufacturing a foil-based package may have the steps of: providing at least one foil substrate having an electrically conductive layer arranged thereon, and patterning the electrically conductive layer such that a first electrically conducting portion and a second electrically conducting portion, which is coplanar to the first electrically conducting portion, and a third electrically conducting portion, which is coplanar to the first electrically conducting portion, are generated, the first electrically conducting portion being arranged between the second and third electrically conducting portions, providing at least one electronic device having a device terminal side which has at least a first device terminal pad, mounting the electronic device on the electrically conductive layer with no bond wire in flip-chip mounting technology so that the device terminal side of the electronic device is arranged opposite the electrically conductive layer, contacting at least a first package terminal pad with the first electrically conducting portion so that the result is a signal path between the first package terminal pad and the first electrically conducting portion and the first device terminal pad, wherein the electronic device is electrically contactable from that side of the foil substrate facing the electronic device by means of the first package terminal pad, wherein the foil substrate has a first foil portion where the first package terminal pad is located, and wherein the foil substrate has a second foil portion where the electronic device is located, the first foil portion and the second foil portion extending along a common foil plane, and applying a casting compound between the first foil portion and the second foil portion so that the casting compound encloses the first package terminal pad and covers the at least one electronic device and divides same from the environment, wherein, in the step of patterning the electrically conductive layer, the first electrically conducting portion is dimensioned such that it is implemented as a signal-guiding waveguide for high-frequency signals, and wherein the second electrically conducting portion, which is coplanar to the first electrically conducting portion, and the third electrically conducting portion, which is coplanar to the first electrically conducting portion, are each implemented as waveguides and form an equipotential surface.

The inventive foil-based package comprises at least one foil substrate comprising an electrically conductive layer arranged thereon. The electrically conductive layer is patterned so as to provide a first electrically conducting portion and a second electrically conducting portion, which is coplanar to the first electrically conducting portion, and a third electrically conducting portion, which is coplanar to the first electrically conducting portion, the first electrically conducting portion being arranged between the second and third electrically conducting portions. In particular, regions having electrically low-resistance characteristics are understood to be electrically conducting portions, wherein low resistance or low impedance means a one-digit range of ohm per square or less. A square here corresponds to a square as a part of a conductive layer. Additionally, the inventive foil-based package comprises at least one electronic device comprising a device terminal side, the device terminal side comprising at least a first device terminal pad. The at least one electronic device is mounted on the electrically conductive layer with no bond wire in flip-chip mounting technology so that the device terminal side of the electronic device is arranged opposite the electrically conductive layer. In addition, the foil-based package comprises at least one, and advantageously a plurality of, package terminal pad arranged at a package terminal side and laterally spaced apart from the electronic device, for electrically contacting the package, wherein at least a first package terminal pad is in contact with the first electrically conducting portion so that the result is a signal path between the first package terminal pad and the first electrically conducting portion and the first device terminal pad. Thus, the electronic device is electrically contactable from that side of the foil substrate facing the electronic device by means of the first package terminal pad. The foil substrate comprises a first foil portion where the first package terminal pad is located. In addition, the foil substrate comprises a second foil portion where the electronic device is located, the first foil portion and the second foil portion extending along a common planar foil plane. A casting compound which encloses the plurality of package terminal pads and covers the at least one electronic device and divides same from the environment is arranged between the first foil portion and the second foil portion. In accordance with the invention, the first electrically conducting portion is implemented to be a signal-guiding waveguide for high-frequency signals and the second electrically conducting portion, coplanar to the first electrically conducting portion, and the third electrically conducting portion, coplanar to the first electrically conducting portion, are each implemented to be waveguides and together form an equipotential surface.

The electrically conducting portions can, for example, be implemented to be strip lines which are also referred to as micro strips. The word micro strip relates to the arrangement on top of the surface of an insulating substrate. In the foil-based package described here, the foil substrate can form the insulating substrate. A coplanar arrangement is understood to be an arrangement of the electrically conducting portions, wherein at least the first electrically conducting portion is at a first electrical potential and arranged between the second and third electrically conducting portions, which both are at a different, second electrical potential, and framed by these. The framed first electrically conducting portion is also referred to as coplanar line. The second and third electrically conducting portions are at the same electrical potential and thus form an equipotential surface. In some embodiments, the second and third electrically conducting portions may, for example, be at ground potential and thus form a ground plane. The coplanar arrangement is determined essentially by the distance between the framed first electrically conducting portion and the equipotential surface (second and third electrically conducting portions).

The electrically conducting portions can be generated by means of a layer arrangement on the foil substrate, the electrically conductive layer being patterned correspondingly so that the result are the electrically conducting portions mentioned. Since the electrically conducting portions are produced from one and the same electrically conductive layer, the electrically conducting portions are located within one and the same plane. In other words, the electrically conducting portions are arranged to be coplanar relative to one another.

These coplanar arrangements, which may also be referred to as coplanar geometries or coaxial-type layer arrangements, are of particular advantage for guiding high-frequency signals. Thus, in particular the first electrically conducting portion arranged in the center is implemented to be a signal-guiding waveguide for high-frequency signals.

A waveguide is to be differentiated from conventional conductive traces (like on printed circuits). As far as their setup is concerned, conventional conductive traces are basically similar to strip lines, wherein, however, conventional conductive traces are not necessarily dimensioned and operated as waveguides. In the case of strip lines implemented specifically to be waveguides, important parameters, like impedance, loss factor, wave propagation speed, dispersion, radiation, for example, must be kept in mind, which only play a rather unimportant role in conventional conductive traces.

Coplanar conductive trace arrangements are usually realized on rigid ceramic substrates. However, the invention provides for implementing coplanar arrangements or topologies in ultra-thin foil packages. The term ultra-thin when referring to the foil-based package relates to thicknesses of less than 300 μm, advantageously thicknesses of less than 200 μm and, even more advantageously, thicknesses of less than 150 μm.

Embodiments provide for the foil substrate to comprise a foil layer thickness $D_F$ of less than 130 μm. Alternatively or additionally, further embodiments provide for the first electrically conductive layer to comprise a layer thickness $D_L$ of less than 20 μm. Alternatively or additionally, further embodiments provide for the electronic device to comprise an element thickness $D_C$ of less than 60 μm. Alternatively or additionally, further embodiments provide for the foil-based package to comprise an overall thickness $D_P$ of less than 300 μm.

BRIEF DESCRIPTION OF THE DRAWINGS

Embodiments of the present invention will be detailed subsequently referring to the appended drawings, in which:

FIG. 1 is a schematic sectional side view of a foil-based package in accordance with an embodiment;

DETAILED DESCRIPTION OF THE INVENTION

Figure 2A:
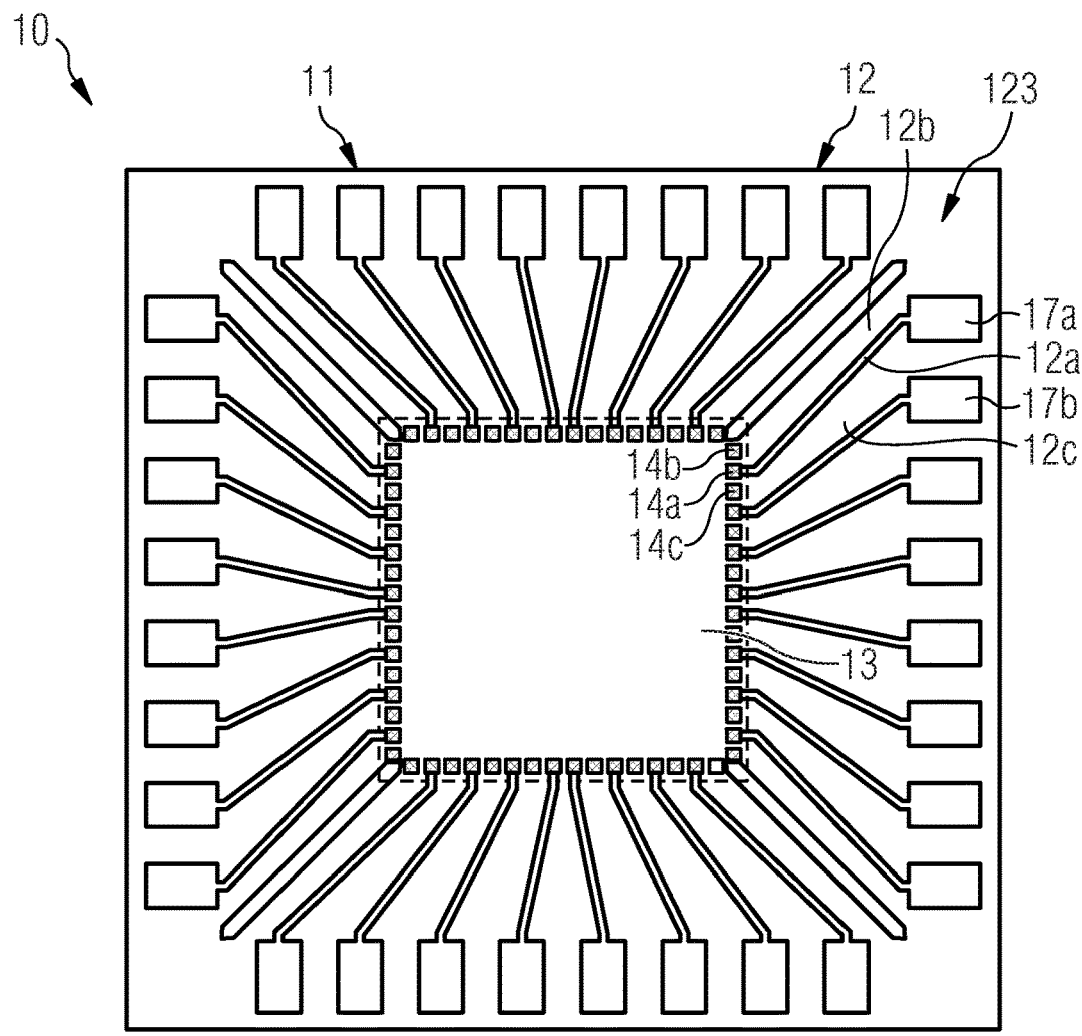
FIG. 2A is a schematic top view of a coplanar topology in accordance with an embodiment.

Embodiments will be described below in greater detail referring to the figures, wherein elements having same or similar functions are provided with the same reference numerals.

Method steps illustrated in a block diagram and discussed in connection with the same may also be performed in a different order than that illustrated or described. Additionally, method steps relating to a certain feature of an apparatus are interchangeable with this feature of the apparatus, also applying vice versa.

Additionally, a standardized package is described here exemplarily using the example of an SMD package or QFN package. However, the invention also relates to package forms complying with other standardizations.

The inventive foil-based package is also referred to as foil package or flex-foil package. In addition, the terms package and housing are used as synonyms. The term ultra-thin when referring to the foil-based package refers to thicknesses of less than 300 μm, advantageously to thicknesses of less than 200 μm and even more advantageously to thicknesses below 150 μm. The thickness corresponds to a layer thickness setup of the foil-based package perpendicularly to the main direction of extension of the foil substrate or perpendicularly to the foil plane. Substrates comprising layer thicknesses of less than 130 μm are also referred to as foil substrates, in the sense of the present invention.

Chips or semiconductor chips are mentioned as a non-limiting example of an electronic device. The description text exemplarily mentions chips which are embedded in a flex-foil package. The term "chip" encompasses implementations comprising a silicon material, other semiconductor substrates, thin glass or foil material. In particular, it must not be ignored that a foil device may be present instead of a "chip". A foil device having a foil thickness of, for example, 25 μm, is within the range of definition for being named "thin chip". Since the manufacturing requirements for structures on the foil chip may differ from the manufacturing requirements for package manufacturing, it may be useful to embed a foil chip in a flex package.

The electronic device may optionally provide a sensor functionality. Non-limiting examples of sensor functions on a foil substrate may be interdigital capacitor structures, amperometric electrodes, resistance meanders, light-sensitive, humidity-sensitive, gas-sensitive, pH-sensitive layers or bioanalytical layers.

FIG. 1 shows a schematic sectional side view of a foil-based package 10 in accordance with an embodiment. The foil-based package 10 comprises at least one foil substrate 11. The foil substrate comprises a first side $11_1$ and an oppositely arranged second side $11_2$. An electrically conductive layer 12 is arranged on the foil substrate 11, more precisely on the first side $11_1$ of the foil substrate 11.

The electrically conductive layer 12 comprises an electrically conductive material. The electrically conductive layer 12 may exemplarily be a metallization.

The terms "conductive layer" and "metallization" differ in that a metallization consists of a metal material (like aluminum, copper, chromium, nickel, gold), whereas a conductive layer may comprise electrically finitely low-resistance particles in a material compound (like silver particles in a paste material or spheres in the range of µm made of a non-conductive or poorly conductive material having a conductive surface coating). In the sense of the present disclosure, the term "conductive layer" forms the generic term for both variations, i.e. for both an electrically conductive layer and for a metallization.

Optionally, a material layer 21 may be applied to the surface of the opposite second main side $11_2$ of the foil substrate 11. Exemplarily, an external coating with the material layer 21 which, due to its characteristics, may also be referred to as barrier coating 21, can be applied to the second main side $11_2$ of the foil substrate 11, which is opposite the electrically conductive layer 12. The barrier coating 21 can exemplarily be characterized by a barrier characteristic and provide a barrier against external influences like humidity or electromagnetic radiation, like light, for example. If the barrier characteristic is low-resistance conductivity, the optional barrier coating 21 may function as an electrical shield. A shield with no connection to a supply voltage potential only serves as an equipotential surface or magnetic shield, whereas a shield with connection to a supply voltage potential represents an electrical alternating-field shield.

The foil-based package 10 comprises at least one electronic device 13. The electronic device 13 may, for example, be an active or a passive electronic device. Exemplarily, the electronic device 13 may be a semiconductor chip. The electronic device 13 comprises a device terminal side 15. The device terminal side 15 comprises one or several device terminal pads 14 for electrically contacting the electronic device 13.

The electronic device 13 is mounted on the electrically conductive layer 12 with no bond wire in flip-chip mounting technology so that the device terminal side 15 of the electronic device 13 is arranged to be opposite the electrically conductive layer 12.

The foil-based package 10 comprises a package terminal side 16 from which the foil-based package 10 is electrically contactable. A plurality of package terminal pads are arranged on the package terminal side 16, wherein a first package terminal pad 17a and a second package terminal pad 17b are exemplarily shown. The package terminal pads 17a, 17b serve for electrically contacting the package 10 and/or the electronic device 13. The electronic device 13 is electrically contactable from the first side 11, of the foil substrate 11, facing the electronic device 13, by means of the first and second package terminal pads 17a, 17b.

The package terminal pads 17a, 17b comprise a terminal-side terminal or contact area 20a, 20b. Surface treatment 148a, 148b of these contact areas 20a, 20b is conceivable in order to improve contacting.

The foil substrate 11 comprises a first foil portion $A_1$ where the first and second package terminal pads 17a, 17b are arranged. More precisely, the foil substrate 11 in this non-limiting example comprises two first foil portions $A_1$, wherein one or several package terminal pads 17a, 17b can be arranged in each of the two first foil portions $A_1$.

Additionally, the foil substrate 11 comprises a second foil portion $A_2$ where the electronic device 13 is arranged. The second foil portion $A_2$ can be arranged between the two first foil portions $A_1$.

The first foil portions $A_1$ each extend from a lateral exterior $11_1$, $11_2$ of the foil substrate 11 to an internal region of the foil substrate 11, or in the direction towards the electronic device 13. The second foil portion $A_2$ is located within an internal region of the foil substrate 11 and is spaced apart from the lateral exteriors $11_1$, $11_2$ of the foil substrate 11. A variable border 131 between the first and second foil portions $A_1$, $A_2$ is located between the electronic device 13 and a package terminal pad 17a, 17b which is nearest to the electronic device 13.

The foil substrate 11 extends along a foil plane E. The foil plane E may pass through the center of the foil substrate 11. The first foil portions $A_1$ and the second foil portion $A_2$ extend in parallel to this foil plane E. The individual foil portions $A_1$, $A_2$ are consequently not offset to one another in a vertical direction (perpendicularly to the foil plane E).

The first foil portions $A_1$ and the second foil portion $A_2$ of the foil substrate 11 comprise an essentially constant layer thickness. Alternative embodiments provide for the first foil portions $A_1$ and the second foil portion $A_2$ to comprise different layer thicknesses.

In addition, the foil-based package 10 comprises a casting compound 19 arranged between the first foil portions $A_1$ and the second foil portion $A_2$. The casting compound 19 encloses the package terminal pads 17a, 17b at least in portions. Advantageously, the casting compound 19 laterally surrounds the package terminal pads 17a, 17b completely, with the exception of a surface or terminal or contact area 20a, 20b mentioned before on the package terminal side 16. In addition, the casting compound 19 covers the at least one electronic device 13, advantageously completely, and divides the electronic device 13 from the environment.

As can additionally be seen in FIG. 1, the first package terminal pad 17a and the second package terminal pad 17b are each spaced apart laterally from the electronic device 13.

The setup exemplarily described referring to FIG. 1, which may be in thin-layer technology, results in an ultra-thin foil-based package 10 which is flexible and can nevertheless comply with conventional standardization criteria. Apart from flexibility, there are further differences to conventional package forms, like SMD: Surface Mount Device, QFN: Quad Flatpack No Lead, CSP: Chip-Size Package and BGA: Ball Grid Array.

Ball Grid Arrays (BGAs), for example, are known, the package terminal pads of which are arranged below the chip and consequently are not spaced apart from it laterally. Other forms of well-known BGAs do have package pads outside the chip region, but these BGAs are considerably thicker than the foil-based package 10 described here, which is why the flexible and thin characteristics of the foil-based package 10 described here cannot be achieved when using conventional package designs.

In accordance with embodiments, the entire foil-based package 10 may comprise an overall thickness $D_P$ of less than 300 µm. This offers the possibility of the entire package 10 to comprise a flexible behavior and to be bent in an elastically deformable manner. Flexibility here refers to changes in shape of a planar area towards a cylindrical curvature, but not a dome-shaped deformation. A cylindrical curvature is, for example, comprised in the flexibility specifications of smart cards.

In addition, the foil substrate 11 may advantageously comprise a foil layer thickness $D_F$ of less than 130 µm. The first electrically conductive layer 12 may advantageously comprise a layer thickness $D_L$ of less than 20 μm. The electronic device 13 may advantageously comprise an element thickness $D_C$ of less than 60 μm.

CSP packages exhibit disadvantages when compared to the inventive foil-based package 10 with an electronic device 13 comprising a device terminal pad 14 (IC pad). Due to the difference in size between IC pads and CSP balls, CSP packages are restricted to relatively few I/O pads. For the so-called re-routing planes in CSP packages, the inventor does not know any inventive topology either.

In an advantageous embodiment, the foil-based package 10 described here can meet specific criteria for standardizations and standards for QFN packages, for example. Package pad geometry and package pad distance are examples of such criteria.

Figure 2B:
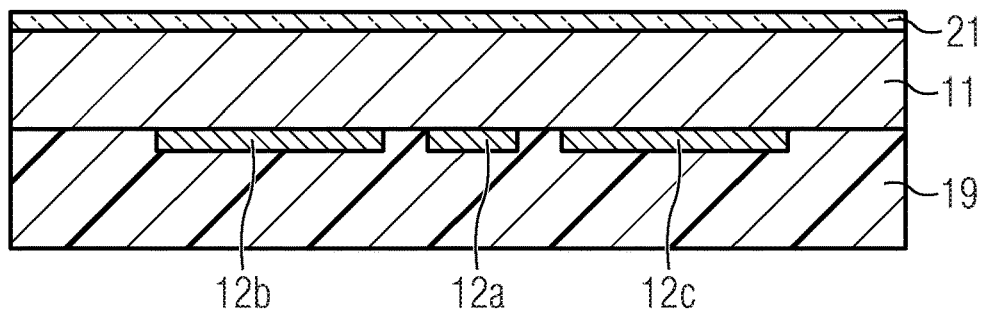
FIG. 2B is a schematic side view of a coplanar topology in accordance with an embodiment.

FIGS. 2A and 2B show further schematic views of a foil-based package 10 in accordance with further embodiments.

FIG. 2A shows a top view of a foil-based package 10 which may basically correspond to the package 10 discussed referring to FIG. 1. The electronic device 13 is arranged roughly in the center of the foil substrate 11. The electronic device 13 comprises a plurality of device terminal pads 14a, 14b, 14c. The device terminal pads 14a, 14b, 14c may exemplarily, as is illustrated, be arranged along lateral outer contours of the electronic device 13.

The foil-based package 10 comprises a plurality of package terminal pads 17a, 17b. The package terminal pads 17a, 17b may exemplarily, as is illustrated, be arranged along lateral outer contours of the foil substrate 11 or package 10.

In the top view represented in FIG. 2A, the electrically conductive layer 12 can clearly be made out. In accordance with the invention, the electrically conductive layer 12 is patterned such that a first electrically conducting portion 12a and a second electrically conducting portion 12b, which is coplanar to the first electrically conducting portion 12a, and a third electrically conducting portion 12c, which is coplanar to the first electrically conducting portion 12a, can be generated. The first electrically conducting portion 12a here is arranged between the second and third electrically conducting portions 12b, 12c and maybe insulated electrically from the second and third electrically conducting portions 12b, 12c.

This is illustrated more clearly in FIG. 2B. In accordance with the invention, the electrically conducting portions 12a, 12b, 12c can be located within the same plane. This corresponds to the definition of a coplanar arrangement as discussed before.

Thus, the first electrically conducting portion 12a is implemented as a signal-guiding waveguide for high-frequency signals. The second electrically conducting portion 12b, which is coplanar to the first electrically conducting portion 12a, and the third electrically conducting portion 12c, which is also coplanar to the first electrically conducting portion 12a, together can form an equipotential surface.

The result is that the first electrically conducting portion 12a can be at a first electrical potential, whereas the second and third electrically conducting portions 12b, 12c each can be at a common, second electrical potential, the first and second electric potentials being mutually different. Exemplarily, the second and third electrically conducting portions 12b, 12c can be at ground potential and thus form a ground equipotential surface, which is also referred to as ground plane.

In this case, this coplanar arrangement is also referred to as ground-signal-ground configuration. The combination of GSG plus backplane (optional material layer 21) is also conceivable. The geometrical proportions of the width of the electrically conducting portions 12a, 12b, 12c to the distances of the electrically conducting portions 12a, 12b, 12c among one another are, in accordance with the invention, to be dimensioned such that an advantageous wave resistance results for a target frequency spectrum.

Exemplarily, the first electrically conducting portion 12a can be dimensioned such that the result is a wave impedance matching for high-frequency signals in the range of 500 MHz or more. Wave impedance matchings for high-frequency signals of 1 GHz or more up to 50 GHz or more are also conceivable.

Another embodiment (not illustrated here) can use a GSSG combination, wherein the voltage difference of two signal-guiding waveguides is used as the actual signal.

The inventive coplanar configuration in combination with an inventive flexible and ultra-thin foil package 10 comprises the advantages described herein.

Making again reference to FIG. 2A, what can be seen is a non-limiting embodiment of a foil-based package 10 with a topology for high-frequency signals, this package comprising a GSG configuration. FIG. 2A exemplarily shows an IC 13, in the center, where each signal line 12a is surrounded by ground lines 12b, 12c for the high-frequency signals. The exemplary sketch is to explain that this combination of signal line 12a, ground lines 12b, 12c and almost constant distance between signal line 12a and ground 12b, 12c allows matching or adjusting the wave resistance to the high-frequency bandwidth of the signals.

However, FIG. 2A does not disclose that all the signal lines have to follow this topology, but there is freedom for other patterning of the low-resistance electrically conductive layer 12. The remaining common feature is that there is at least one topology region for which there is the coplanar topology. The connection of the ground equipotential surface 12b, 12c, the patterning of which is also illustrated only exemplarily in FIG. 2a, to the system environment into which the ultra-thin HF-QFN foil package 10 is integrated, may be done in at least one corner region 123, for example.

The topology illustrated in FIG. 2A has not been standardized in JEDEC, but can be implemented within the methods of the JEDEC standardization. The geometries selected for visualization purposes roughly correspond to the situation for QFN pads having a width of 200 μm and a distance of 200 μm.

Figure 2C:
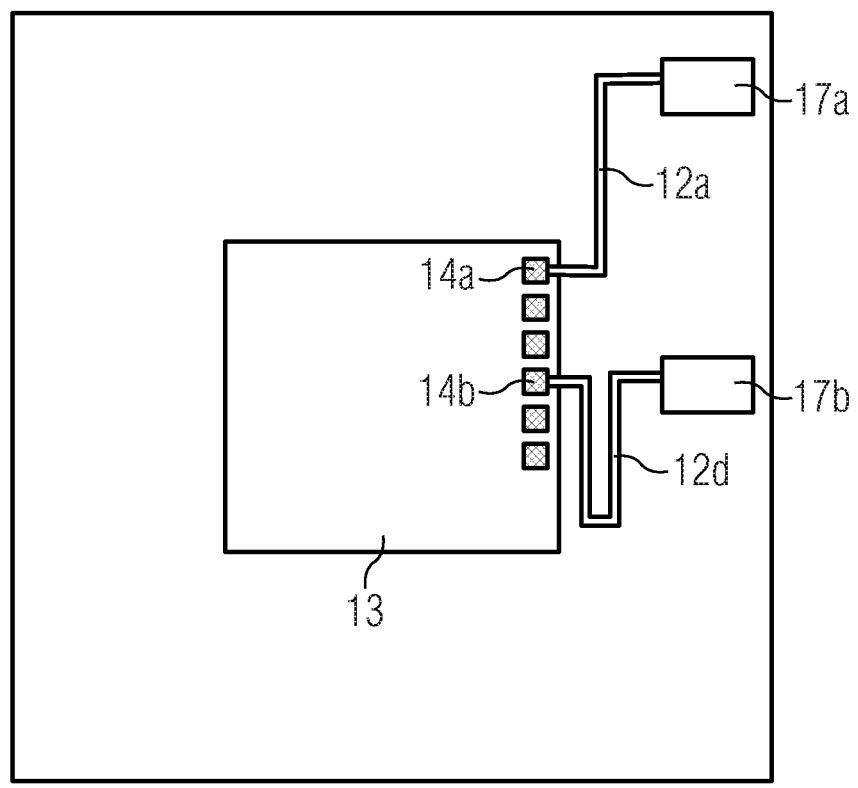
FIG. 2C is a schematic top view of a coplanar topology in accordance with an embodiment.

FIG. 2C schematically shows another embodiment. Purely exemplarily, only two package terminal pads 17a, 17b are illustrated here. Every package terminal pad 17a, 17b can be connected to one device terminal pad 14a, 14b each, which applies to all the embodiments described herein. In the embodiment illustrated in FIG. 2C, the first package terminal pad 17a is connected to a first device terminal pad 14a by means of a signal-guiding first electrically conducting portion 12a (waveguide) and the second package terminal pad 17b is connected to a second device terminal pad 14b by means of another electrically conducting portion 12d (waveguide).

As can be seen, the two package terminal pads 17a, 17b comprise different distances to the electronic device 13. However, this embodiment provides for the geometrical lengths of the first electrically conducting portion 12a and the further electrically conducting portion 12d to be adjusted to each other by means of different shaping such that the geometrical lengths will be equal. This may exemplarily be done by means of the meandering structure of the further electrically conducting portion 12d illustrated exemplarily in FIG. 2C. Thus, a signal run time adjustment can be performed despite differently spaced package terminal pads 17a, 17b.

FIGS. 3A to 3G show an exemplary process flow describing how the foil-based package 10 can be produced. FIGS. 3A to 3G are purely schematic and not to scale, i.e. the figures are not scaled geometrically as is the case in a real implementation. In order to make the layer sequence and the borders of layers among one another clear, the layer thicknesses are illustrated in an enlarged manner. The lateral dimensions are partly represented in a shortened manner.

Figure 3A:
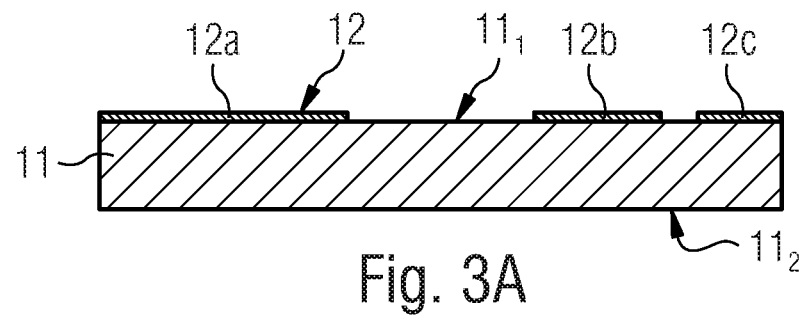
FIGS. 3A-3G are schematic sectional side views for illustrating a method for manufacturing a foil-based package in accordance with an embodiment.

FIG. 3A shows a foil substrate 11. The foil substrate 11 comprises a first main side $11_1$ and an oppositely arranged second main side $11_2$. A first electrically conductive layer 12 is applied to the surface of the first main side $11_1$, for example by means of deposition. The electrically conductive layer 12 can be patterned, thereby forming portions of electrically low-resistance characteristics or electrically conducting portions 12a, 12b, 12c. "Electrically low-resistance", in the sense of the present disclosure, means an order of magnitude which is at most in a one-digit range of ohms per square, a square corresponding to a square as a part of the electrically conductive layer 12.

Figure 3B:
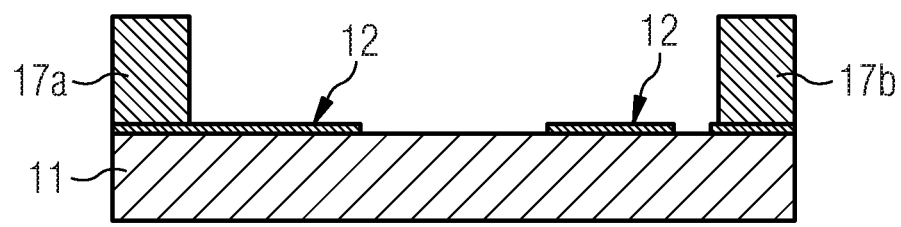
Figure 3C:
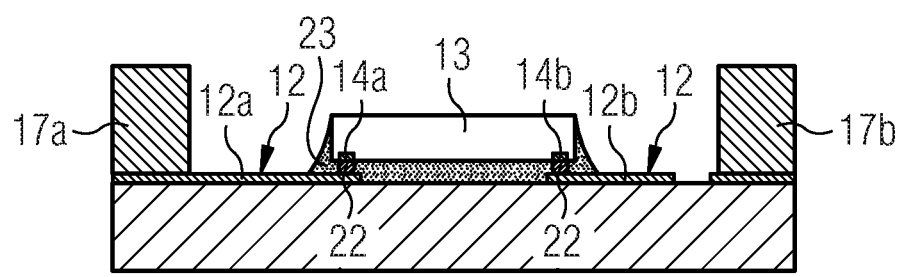

The electrically conductive layer 12 can be patterned such that signal paths (signal-carrying electrically conducting portions 12a, 12d) are guided outwards in the direction of the edge of the foil package 10 to be separated (i.e. mutually electrically insulated) from the device terminal pads 14a, 14b or IC pads (FIG. 3C). Thus, in particular, the first electrically conducting portion 12a can be electrically insulated from the second electrically conducting portion 12b and the third electrically conducting portion 12c. The electrically conductive layer 12 may consist of several layer parts, maybe differing in size range, wherein the border layer to the foil substrate 11 may exhibit a characteristic of good adhesion to the electrically conductive layer 12. Differing in size range here exemplarily means a relation of a 40 nm adhesive layer relative to a 400 nm or 4.000 nm thickness of the electrically conductive layer 12. Such relations may frequently occur in the layer parts of the electrically conductive layer 12.

As has been mentioned before referring to FIG. 1, an optional barrier coating 21 (not illustrated in greater detail here), which may serve, for example, for protection from humidity or electromagnetic radiation can be provided on the second main side $11_2$ of the foil substrate 11. The external barrier coating 21 may consist of several layer parts, among which are conductive and non-conductive layer parts. This barrier coating 21 will be described below in greater detail referring to FIGS. 4 and 5.

Figure 4:
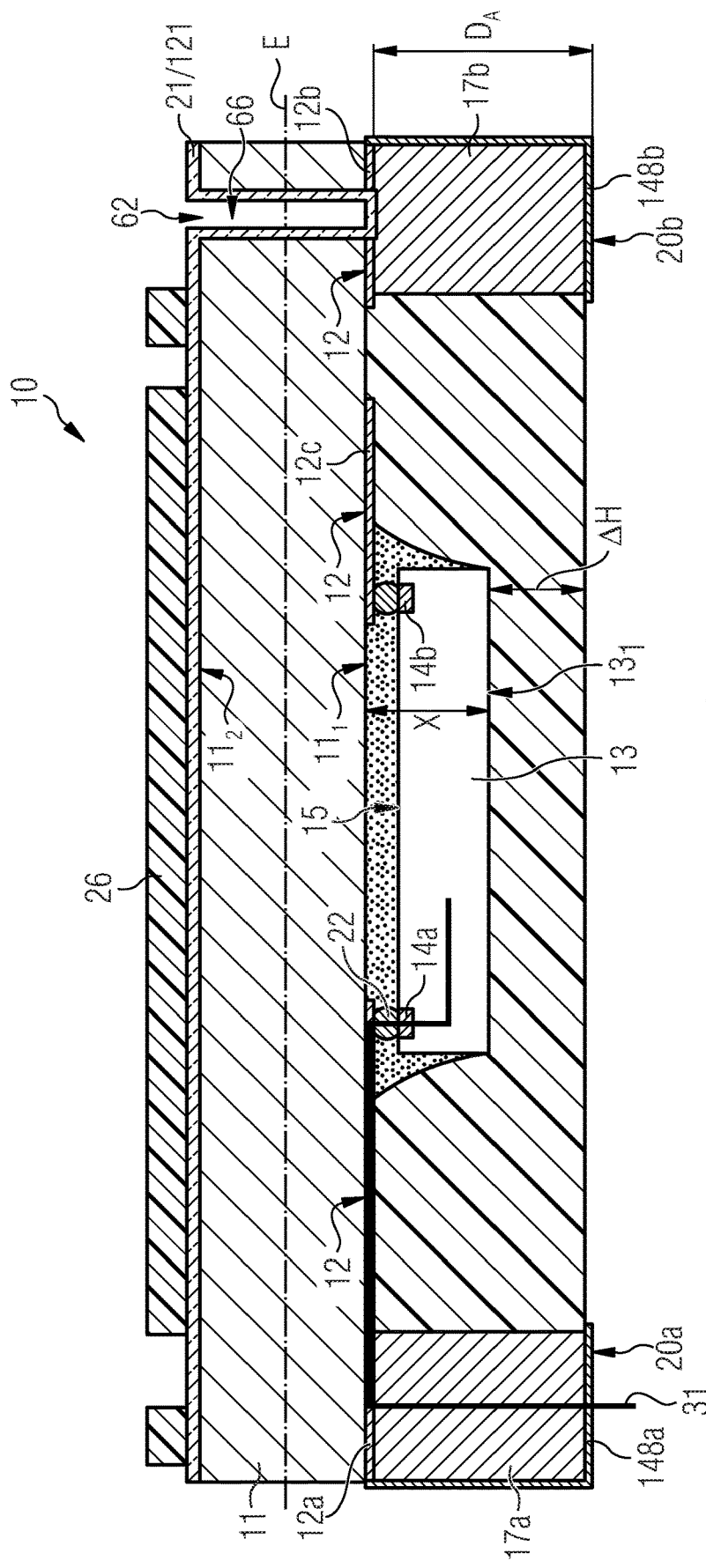
FIG. 4 is a schematic sectional side view of a foil-based package in accordance with an embodiment, for illustrating a signal path.
Figure 5:
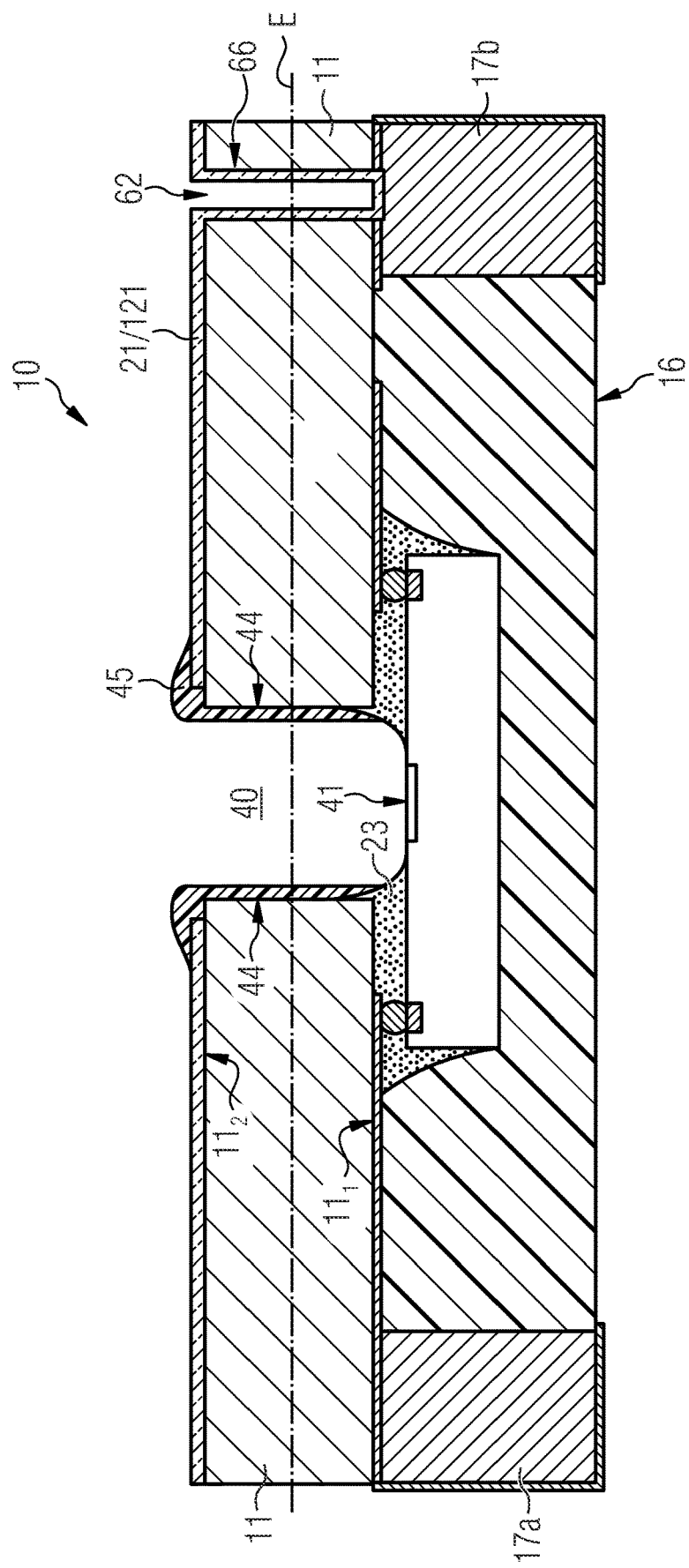
FIG. 5 is a schematic sectional side view of a foil-based package in accordance with an embodiment, comprising a media access opening.

Another exemplary embodiment which will also be discussed below in greater detail referring to FIGS. 4 and 5 provides for an electrical connection (through contacting or via 62) between the optional barrier coating 21 and the electrically conductive layer 12. There may be one individual via 62 or there may be more than one via 62, wherein the geometrical position can be selected such that the desired electrical connection to a patterned region (electrically conducting portion 12a, 12b, 12c) results in the electrically conductive layer 12.

In summary, FIG. 3A shows that an optional material layer 21 can be applied to a surface $11_2$ of a foil substrate 11 (top side, for example) and that a first electrically conductive patterned layer 12 (like metallization) can be generated on another, like opposite, surface $11_1$ of the foil substrate 11 (like lower side). This means that an electrically conductive patterned layer 12 which is relatively thin with values in the order of magnitude of approximately 10 µm, is generated on the foil substrate 11. In specific embodiments, an order of magnitude of approximately 10 µm exemplarily means 4 µm or 5 µm or 6 µm or 7 µm or 8 µm or 9 µm or ≤12 µm.

FIG. 3B shows another conceivable method step, producing a plurality of (in this case exemplarily two) package terminal pads 17a, 17b. Here, a second electrically conductive layer may be arranged, like deposited, on the first electrically conductive layer 12. The second electrically conductive layer may correspondingly be patterned such that the package terminal pads 17a, 17b illustrated will form. The package terminal pads 17a, 17b are arranged on the first electrically conductive layer 12 and galvanically connected to the first electrically conducting layer 12.

In summary, FIG. 3B shows applying a second electrically conductive layer on the first electrically conductive layer 12 or foil substrate 11. The second electrically conductive layer can be patterned by means of patterning methods so that the result is a patterned layer which will take the function of package terminal pads 17a, 17b. The geometrical arrangement of this patterned second electrically conductive layer, or of the package terminal pads 17a, 17b, can comply with standardization requirements. This means that, in interaction between the chip thickness and the overall arrangement of an ultra-thin flex package 10, another electrically conductive patterned layer is produced which may take the geometries of the package terminal pads 17a, 17b. This further electrically conductive layer may, for example, be generated in an additive electroplating or galvanic technology.

A considerable different to conventional packages is that the chip 13 (FIG. 3C) is not arranged on a lead frame. This is part of the solution for the low overall thickness of the ultra-thin flex package 10.

Another difference to conventional packages is that, in the inventive foil-based package 10, the conductive trace topology comprises a mixture of coplanar wiring and at least one ground plane (full-area ground equipotential surface), which can provide an electrical shield at the same time.

Another considerable difference is the flexibility of the electronic device 13. When thinning a silicon material, for example, down to an order of magnitude of approximately 50 µm, the silicon material will obtain a certain bending characteristic. When reducing the thickness of the silicon substrate of a semiconductor chip 13, for example, bending stress and bending radii may be matched to one another such that no Si chip breaking will occur but nevertheless a function can be obtained which cannot be achieved using rigid devices. In applications like Smart Cards, for example, having integrated electronics, this function may be of great importance.

The phrase mentioned in connection with thinning silicon of "approximately 50 µm" may, for example, be 60 µm or 50 µm or 40 µm or 30 µm or 15 µm or a similar value.

FIG. 3C shows an arrangement of such a thin electronic device 13 on the foil substrate 11. The electronic device 13 may exemplarily comprise an integrated circuit (IC) or semiconductor chip. The electronic device 13 is coupled to the electrically conductive layer 12 in an electrically conducting manner. Advantageously, the electronic device 13 comprises a plurality of device terminal pads 14a, 14b, wherein one device terminal pad 14a, 14b each can be connected to an electrically conducting portion 12a, 12b each and, via the same, to a package terminal pad 17a, 17b each.

This may, for example, be performed by means of suitable metallizations. Exemplarily, bump metallizations or pillars 22 which topographically protrude beyond the passivation surface of the electronic device 13 may be located on the device terminal pads 14, 14b (like IC pads).

A pillar exemplarily means a metal structure the lateral dimension of which is smaller than the area of the device terminal pad 14 (like IC pad) and the height of which can be in the order of magnitude of 10 μm or 15 μm, for example, or 20 μm or 25 μm or 30 μm.

A conductive pattern which topographically protrudes from the metallization of the device terminal pad 14 (IC pad) beyond the surface of the IC passivation is referred to as bump 22, for example, so that the bumps 22 in the order of magnitude of 2 μm or 3 μm or 4 μm, for example, represent a topography on the IC pad-side surface.

The geometrical measure by which the bumps 22 protrude topographically depends on the technology using which the bumps 22 are generated. In so-called UBM technology, the topography is, for example, <10 μm, in pillar technology >10 μm, or in stud-bump technology >20 μm, for example. In order to realize the object of a thin foil package 10, advantages will result when using technologies of small topographic dimensions for the bumps 22.

Consequently, there is an electrical signal connection between an IC bump 22 and the electrically conductive coating 12 (like metallization) in the foil package 10, which advantageously is realized in a low-resistance manner by providing one or several conductive elements in the mounting process of the electronic device 13 on the foil substrate 11 between the surfaces of the bumps 22 and the surface of the electrically conductive coating 12, or a direct low-resistance contact between a bump 22 and the electrically conductive coating 12. Such conductive elements are present in, for example, mounting materials, like anisotropically conductive adhesives or anisotropically conductive adhesive foils, for example, as is indicated in FIG. 3C by the reference numeral 23. When setting up the foil package 10, that surface of the electronic device 13 comprising the bumps 22 faces that surface of the foil substrate 11 which comprises the electrically conductive layer 12 (so-called flip-chip orientation). There are no bond wires present.

The variation mentioned where there is a direct low-resistance contact between a bump 22 and the electrically conductive layer 12 has no specific figure of its own since only the additional mounting material 23 which, in FIG. 3C, is located between a bump 22 and the electrically conductive layer 12, for example, is replaced by the low-resistance contact path or the direct contact between the pillar, for example, and the electrically conducive layer 12.

As is also represented in FIG. 3C, the electronic device 13 may be mounted on the first electrically conductive layer 12 with no bond wire in flip-chip mounting technology, for example. Among the newer methods and technologies for flip-chip assembly, there are machines optimized specifically for mounting (flip-chip bonders) and materials like ACA (anisotropically conductive adhesive) or ACF (anisotropically conductive adhesive film). Such a mounting material 23, like ACA or ACF, may be arranged between the electronic device 13 and the electrically conductive layer 12.

In the case of ACA or ACF technology, chip mounting material 23 and chip contact material are a common material system. In the case of stud bumps 22 or pillar technology, these are separate materials.

For reasons of completeness, it is to be mentioned here that, in the figure sequence illustrated, only one metallization is illustrated in the region of the device terminal pad 14a, 14b (IC pad), although real semiconductor chips 13 may contain several metallization layers.

Figure 3D:
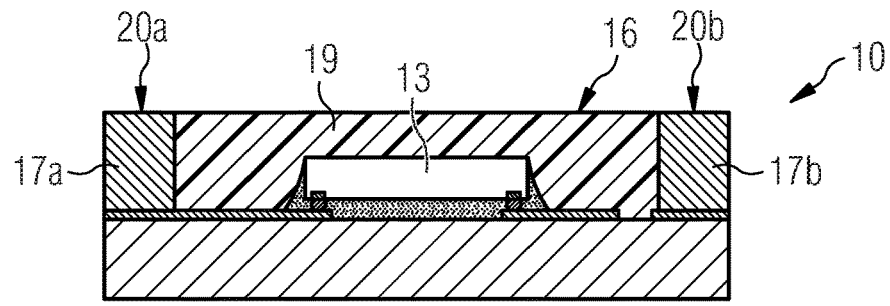

FIG. 3D shows a finished foil-based package 10. A casting compound 19 which encloses the package terminal pads 17a, 17b laterally at least on one side, but advantageously completely, with the exception of the contact areas 20a, 20b on the package terminal side 16, is arranged between the package terminal pads 17a, 17b. The casting compound 19 additionally covers the electronic device 13 advantageously completely and thus divides same from the external environment. The casting compound 19 may basically be applied in any of the steps following after arranging the electronic device 13.

The finished foil package 10 is formed on a foil substrate 11, wherein the thickness of the foil substrate 11 may, for example, be 125 μm or 50 μm or 25 μm or less than 25 μm. Polyimide (Pi) or polyethylene naphthalate (PEN) or polyethylene terephthalate (PET) or polycarbonate (PC) or different materials are possible foil materials. Selecting the material may depend on which temperatures act on the foil substrate 11, both when manufacturing the foil package 10 and also in the mounting process of the foil package 10 in a system. The temperatures will continue to act in the application due to the operating states of the foil package 10 (operating temperatures).

Figure 3E:
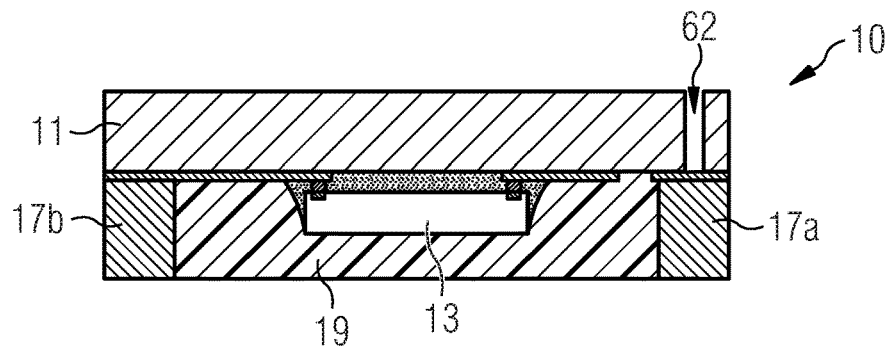

FIG. 3E shows a conventional installation position for assembling the foil-based package 10 in a system environment. The pin arrangement of this package 10 may be implemented to be compatible with the pin arrangement of standard packages, without entailing re-wiring. This complies with several points of the object mentioned before. In addition, in FIG. 3E, an optional through contacting 62, which can also be referred to as via, is shown which will be discussed below in greater detail referring to FIGS. 4 and 5.

Figure 3F:
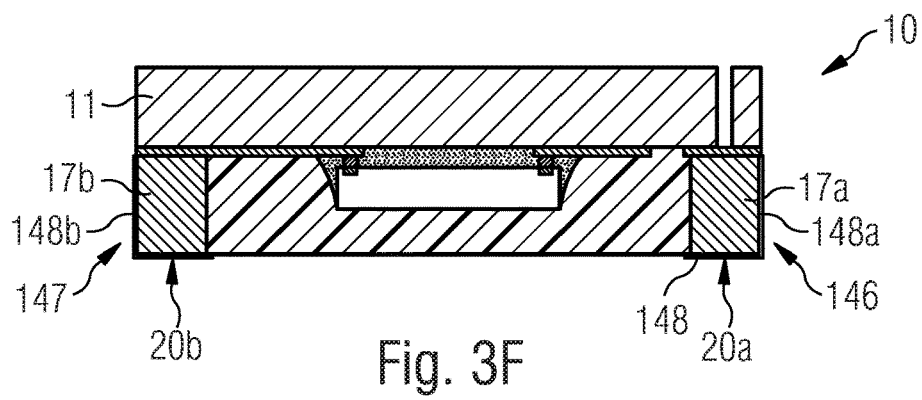

FIG. 3F shows another optional step where a surface treatment layer 148a, 148b can be arranged, at least in portions, at the package terminal pads 17a, 17b. A surface treatment layer 148a, 148b can be applied to the contact areas 20a, 20b of one or several package terminal pads 17a, 17b, for example. Alternatively or additionally, one respective surface treatment layer 148a, 148b can be applied to lateral outer contours 146, 147 of one or several package terminal pads 17a, 17b. A package pad surface treatment 148a, 148b is only optional, like for making contacting the package 10 in a system environment easier. When the surface treatment 148a, 148b takes place by means of currentless deposition at the end of the manufacturing line, for example, the layer thickness of the surface treatment 148a, 148b (as illustrated in the Figure) will protrude, but only in a nanometer-scale range, like 500 nm nickel-gold or tinning.

Figure 3G:
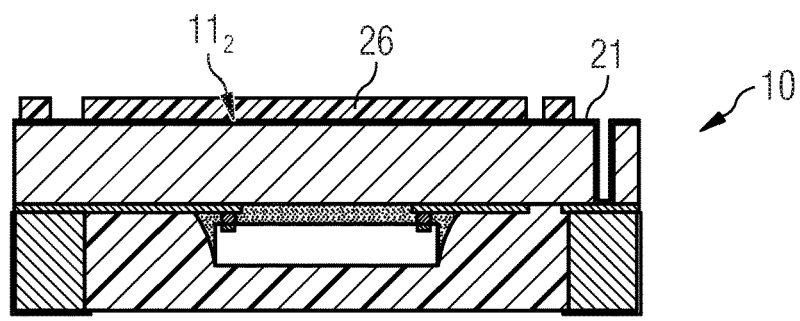

FIG. 3G shows another optional step where another layer 26 is applied to the surface of the second main side $11_2$ (that side facing away from the electronic device 13) of the foil substrate 11. The further material layer 26 may exemplarily be arranged on the optional material layer 21, if present. The further layer 26 may exemplarily be a further protective layer or labelling. Optionally, as is illustrated in FIG. 3G, a further layer 26 may be applied, which exemplarily corresponds to the labelling of a device.

FIG. 4 shows a schematic view of an embodiment of a foil-based package 10, including an exemplarily illustrated signal path 31. This embodiment basically corresponds to the embodiment discussed before referring to FIG. 3G, wherein the via 62 and the barrier coating 21 and the further layer 26 are still optional.

The signal path 31 is to be described at first. When starting with the chip electronics, i.e. from the electronic device 13 embedded on the foil substrate 11, a signal passes a device terminal pad 14a (IC pad), including a bump 22, which topographically protrudes beyond the passivation plane of the chip surface. Representing the different possible connecting technologies (ACA, ACF, Pillar, StudBump, SLID (solid liquid interdiffusion)) or the like, a connective element between the electronic device 13 and the electrically conductive layer 12 (like metallization) on a first surface $11_1$ of the foil substrate 11 is conceivable.

The electrically conductive layer 12 abuts on a first surface $11_1$ of the foil substrate 11 on the one hand and, in the signal path, on a further electrically conductive layer which (as described before) can form the package terminal pads 17a, 17b, on the other hand. The thickness DA of the package terminal pads 17a, 17b may serve for at least partly compensating the topographical position relations relative to the thickness of the ultra-thin electronic device/s 13 (like chips).

Subsequently, the signal path 31 passes along the electrically conductive layer 12, i.e. along the electrically conducting portions 12a, 12b, to the respective package terminal pad 17a, 17b. Only exemplarily, FIG. 4 focuses on a single signal path 31 which extends along a first device terminal pad 14a and the first electrically conducting portion 12a and the first package terminal pad 17a. However, the same applies also for the other electrically conducting portions 12b, 12c and package terminal pads 17b, 17c.

The signal path 31 passes through the respective package terminal pad 17a, wherein, for topology, the arrangement of the package terminal pads 17a, 17b in top view may exemplarily correspond to the visualization sketch of FIG. 2A. An optional surface treatment 148a, 148b of the border layer of the package terminal pads 17a, 17b at the package contour can be performed by means of current or currentless deposition of a metallization.

As can be seen in FIG. 4, the result of the surface treatment 148a, 148b is a low topography in that surface of the package 10 which later on faces the system surface when being assembled to a system. This topography can comply with the measures of JEDEC standardization.

As has been mentioned before, a barrier coating 21 can be arranged on the second main side $11_2$ (that side facing away from the electronic device 13) of the foil substrate 11. The same can be characterized by its barrier characteristic against external influences, like humidity or electromagnetic radiation. When the barrier characteristic is low-resistance conductivity, the barrier coating 21 can function as an electrical shield, as is exemplarily also to be seen in FIGS. 2 and 3 for the coplanar topology and ground plane.

Regions of the package terminal pads 17a, 17b, which can be seen in FIGS. 1, 4 and 5, are illustrated to be perpendicular to the surface of the foil substrate 11 or perpendicular to the foil plane E. Other cross-sections result in the case of laser processing or chemical/electrochemical processes (like plasma etching), for example, in the process module for technologically patterning the electrically conductive layer 12 which is responsible for producing the package terminal pads 17a, 17b. When patterning by means of laser processing, a trapezoidal cross-sectional structure of the package terminal pads 17a, 17b can be present. In analogy, this similarly applies to the perpendicularly illustrated regions for connecting the barrier coating 21 to the electrically conductive layer 12 by means of the through contacting 62.

The through contacting 62 which is also referred to as via extends, advantageously completely, through the foil substrate 11, perpendicularly to the foil plane E. The location indicated of this through contacting 62 may additionally be varied when compared to the view illustrated in FIG. 4.

As mentioned before, the barrier coating 21 can be electrically conductive. Alternatively or in addition to the barrier coating 21, an electrically conductive coating 121 may be arranged on the second side $11_2$, facing away from the electronic device 13, of the foil substrate 11.

This means that the electrically conductive coating 121 can be a material layer different from the barrier coating 21, or alternatively the electrically conductive coating 121 may be the optional barrier coating 21. The optional barrier coating 21 and/or the electrically conductive layer 121 may each be implemented to be a barrier coating for protection against humidity or electromagnetic radiation. In addition, like the barrier coating 21, the electrically conductive coating 121 may consist of several layer parts, among which can be conductive and non-conductive layer parts.

The electrically conductive connection (via) 62 is arranged between the electrically conductive layer 12 arranged on the first side $11_1$, facing the electronic device 13, of the foil substrate 11 and the barrier coating 21 or electrically conductive coating 121 arranged on the second side $11_2$, facing away from the electronic device 13, of the foil substrate 11.

The via 62 can be in contact with at least one of the electrically conducting portions 12a, 12b, 12. In the non-limiting embodiment in accordance with FIG. 4, the via 62 may exemplarily be in contact with the second electrically conducting portion 12b. Exemplarily, the second electrically conducting portion 12b can be grounded, as described before. In this case, the barrier coating 21 or the electrically conductive coating 121 would be connected in an electrically conducting manner to the grounded second electrically conducting portion 12b (or a grounded portion of the electrically conductive layer 12) by means of the through contacting 62, thereby forming an electrical shield of the foil-based package 10. The second electrically conducting portion 12b in turn may be part of a larger ground plane.

Alternatively, the via 62 can be connected to a supply voltage potential, instead of ground, so that the barrier coating 21 or electrically conductive coating 121 can correspond to an electrical alternating-field shield.

Alternatively or additionally, the electrically conductive layer 12 can be electrically contactable from that side $11_2$ of the foil substrate 11 facing away from the electronic device 13 by means of the through contacting 62.

Alternatively, instead of galvanic coupling between the electrically conductive layer 12 and the optional electrically conductive material layer 21, 121 by means of the via 62, capacitive coupling, forming through the foil substrate 11, can be provided between the electrically conductive layer 12 and the optional electrically conductive material layer 21, 121. Thus, the via 62 could be omitted, but nevertheless electrical shielding be provided.

In the corresponding figures, the through contacting 62 is illustrated to be somewhat lowered, i.e. a recess 66 used for the through contacting 62 in the foil substrate 11 extends a bit into the package terminal pad 17b. The meaning of this is that, in order to ensure contacting, patterning is rather to be performed a little too deep than too little extent. Since the layer thickness of the electrically conductive layer 12 may be approximately 4 μm to 12 μm, whereas the package pad thickness $D_P$ may be in the order of magnitude of 50 μm to 100 μm, the safe manufacturing process entails patterning a little too deep. Alternatively, it would also be conceivable for the recess 66 in the foil substrate 11 to stop at the electrically conductive layer 12.

The distance between the optional material layer 21, 121 and the lateral edge of the media opening 40 is present when manufacturing the media opening 40 takes place before applying the optional material layer 21. However, a manufacturing process where the media opening 40 is produced in two steps, is also conceivable, wherein, in a first step, a recess in the foil substrate 11 is produced from the first main side 11$_1$ and subsequently the chip 13 is mounted, and wherein, in a second step, the media access opening 40 is produced from the second main side 11$_2$.

The advantage of this variation is that, although two patternings produced from different sides 11$_1$, 11$_2$ are to match each other, no temporary protective cap must be present over the media opening 40 for depositing the optional material layer 21, 121.

Another variation is conceivable where, before producing the media opening 40, at first depositing the optional material layer 21, 121 takes place. A second deposition of the optional material layer 21, 121 would be used for the through contacting 62, which is uncritical as regards the distance to the media opening 40, i.e. a temporary protective cap with no geometrical challenges, which is also suitable for serious production, would be conceivable.

Producing the media opening 40 only after manufacturing the optional material layer 21, 121 would be of economic advantage, wherein in this case the optional material layer 21, 121 would be flush with the edge of the media opening 40.

As can also be seen in FIG. 4, the electronic device 13 comprises a device surface 13$_1$ arranged opposite the device terminal side 15. The device surface 13$_1$ is spaced apart from the first side 11$_1$ (the side facing the electronic device 13) of the foil substrate 11, or the electrically conductive layer 12, in a direction perpendicular to the foil plane E. This corresponds to a structural height X.

As mentioned before, the package terminal pads 17a, 17b comprise a contact or terminal area 20a, 20b for electrical contacting at their side facing away from the foil substrate 11. The package terminal pads 17a, 17b extend from the electrically conductive layer 12, in a direction perpendicular to the foil plane E, across the structural height X of the electronic device 13, the result being a difference in height ΔH between the electronic device 13 (or the device surface 13$_1$) and the respective terminal areas 20a, 20b of the first and/or second package terminal pad 17a, 17b.

The casting compound 19 here is arranged at the foil-based package 10 such that it compensates this difference in height ΔH between the terminal areas 20a, 20b of the package terminal pads 17a, 17b and the device surface 13$_1$ of the electronic device 13.

Here, the casting compound 19 is arranged between the electronic device 13 and the package terminal pads 17a, 17b, with the exception of the respective terminal areas 20a, 20b. This means that the casting compound 19 surrounds the package terminal pads 17a, 17b laterally at least on one side, advantageously on all sides, with the exception of the respective terminal areas 20a, 20b.

In some embodiments, the casting compound 19 may be flush with the respective terminal area 20a, 20b of the package terminal pad 17a, 17b or flush with a respective plurality of terminal areas of the plurality of package terminal pads. Flush in this case means that the casting compound 19 and the package terminal pads 17a, 17b are located on the same horizontal height level.

In a region remote from the package terminal pads 17a, 17b, the real technical implementation may not exhibit precise flushness as is shown in the schematic figure, for example due to manufacturing-technological reasons or manufacturing-technological tolerances.

Additionally, the features of the embodiment described referring to FIG. 4 are combinable with any other embodiments discussed herein.

FIG. 5 shows another embodiment of a foil-based package 10, this embodiment additionally comprising an optional media access opening 40.

The electronic device 13 illustrated may exemplarily be a sensor chip. Basically, different forms of sensor chips are known which can roughly be subdivided into those sensor functions not requiring media contact for detecting sensor signals, and those sensor functions for which media contact is used. An acceleration sensor is an example of a sensor function with no media contact.

An example of a sensor function with media contact may be a medical analysis sensor which contacts a serum (medium) to be examined by means of sensors on the chip surface so as to generate a sensor signal.

In the context of flex-foil packages, optical sensors may also be considered to be sensors with media contact, since, depending on the optical transparency of the foil material, contact with the "optical radiation" medium can be possible with or without a media access opening in the foil material.

FIG. 5 shows such a media access opening 40 in the foil-based package 10 so that the medium (analyte) to be examined allows contact to the chip surface in such a way that the interaction between the medium and the chip 13 is suitable for generating sensor signals.

FIG. 5 shows a schematic sectional view of the conceptional arrangement of layers. It is to be considered in particular that the lateral geometrical relations (dimensions) are not illustrated to scale relative to the layer thicknesses. In the case of a uniform scale, the layer thicknesses in ultra-thin packages 10 would be so small in relation to the lateral dimensions of the chips 13 or package 10 that the layer sequence could no longer be comprehensible.

Conversely, in FIG. 5, the region with which the chip surface can contact the medium appears laterally too small. However, the conceptional arrangement is comprehensible in detail.

At first, FIG. 5 shows a foil-based package 10 comprising an opening 40. Since the opening 40 allows contact between a medium to be examined, or analyte, and the electronic device 13, the opening 40 is also referred to as media access opening.

The opening 40 extends advantageously completely through the foil substrate 11 to the electronic device 13, so that the electronic device 13 can be brought into contact with an environment through this opening 40, at least in portions.

The opening 40 advantageously extends perpendicularly to the main direction of extension of the foil substrate 11 or perpendicularly to the foil plane E. It is also of advantage for the opening 40 to extend through the foil substrate 11 to the electronic device 13 in the shortest manner possible. Here, the opening 40 may be arranged in a region of the foil substrate 11 which is opposite the electronic device 13, for example. The opening 40 may additionally extend through the foil substrate 11 with no interruption and basically linearly.

If the foil-based package 10 comprises the optional barrier coating 21 and/or the optional electrically conductive coating 121 on that side 11$_2$ of the foil substrate 11 facing away from the electronic device 13, the opening 14 may also extend through this optional material layer 21, 121. The diameter of the opening 40 within the foil substrate 11 may be smaller than or equal to the diameter of the opening 40 in the material layer 21, 121.

This means that the recess or opening 40 in the optional material layer 21, 121 on the second (external) surface $11_2$ of the foil substrate 11 exemplarily is suitably greater than the opening 40 in the foil substrate 11 so as to visualize that, depending on the manufacturing method of the opening 40 in the foil substrate 11 and the opening 40 in the optional material layer 21, 121, there may be no edge coverage of the optional material layer 21, 121 at the opening 40 of the foil substrate 11.

This lateral distance between the optional material layer 21, 121 and the edge of the opening 40 in the foil substrate 11 is to be understood to be only a non-limiting example. In the foil package 10, the optional material layer 21, 121 may be manufactured before producing the media opening 40, and patterned suitably so that the illustrated lateral distance can be omitted.

If the foil-based package 10 comprises a mounting material 23, the opening 40 may also extend through this mounting material 23. The illustrated detail shows that, when mounting the thin electronic device 13 (chip) at the edge to the foil-substrate opening 40, the mounting material 23 may be fitted correspondingly.

As can be recognized in FIG. 5, the electronic device 13 may comprise a sensor area which is also referred to as sensor portion 41. The sensor portion 41 is implemented so as to provide a sensor functionality based on contacting a medium present in the environment, wherein the opening 40 exposes at least the sensor portion 41 so that the sensor portion 41 can be brought into contact with the medium present in the environment through this opening 40.

Examples of sensor functions with media contact may be a humidity sensor package, or a gas sensor or a fluid sensor (liquid analytics) or a medical sensor, wherein, among other things, in the higher frequency range, surface acoustic wave or microwave impedance spectroscopy signals for sensor interaction with a medium are to be considered. This sensor embodiment may also be of advantage for a setup and connection technology including optical waveguides.

The opening 40 in the foil substrate 11 may comprise suitably larger dimensions than corresponds to the sensor area 41 on the chip surface.

Advantageously, the opening 40 is arranged on a side of the foil-based package 10 opposite the package terminal side 16. Thus, the foil-based package 10, with its package terminal side 16, can be connected to and contacted on another support (not illustrated here), like a substrate or an element, for example, so that the opening 40 is arranged to be opposite the support. This means that the opening 40 would be located on the top side of the foil-based package 10 when being mounted on the support and contacted. Thus, free accessibility of the medium to be measured, or analyte, to the sensor portion 41 of the electronic device 13 can be ensured. Expressed differently, electrical contacting of the foil-based package 10 takes place on that package side 16 facing away from the side having media contact.

An optional further embodiment provides for a material layer 45 to be arranged at lateral side walls 44 of the opening 40 extending through the foil substrate 11. Exemplarily, the material layer 45 can be a protective layer so that the foil substrate 11 is not damaged when being processed, or to keep analytes, which are aggressive for the foil substrate material, away from the foil substrate 11.

Figure 6:
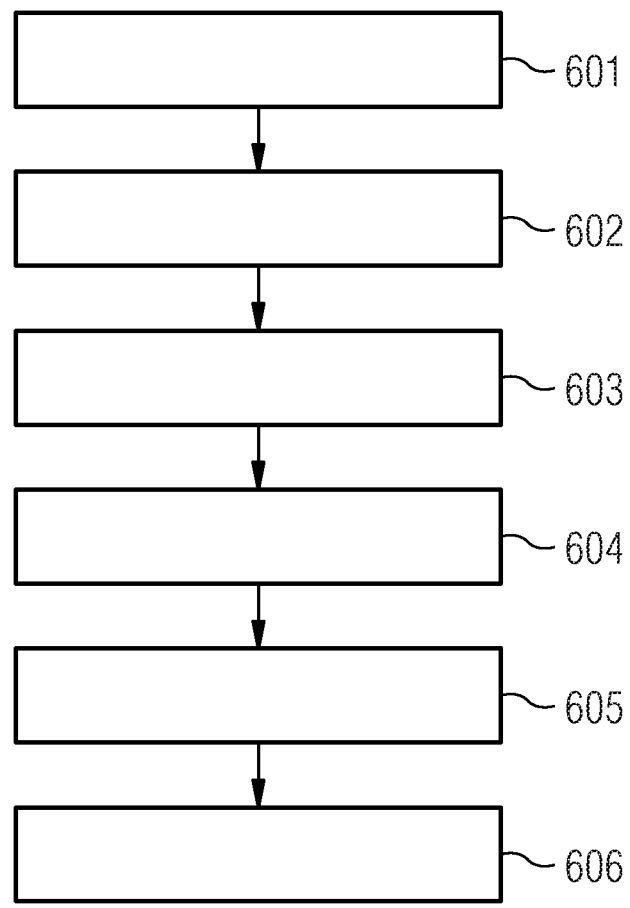
FIG. 6 shows a block diagram of a method for manufacturing a foil-based package in accordance with an embodiment.

FIG. 6 shows a schematic block diagram of an inventive method for manufacturing a foil-based package 10.

In block 601, at least one foil substrate 11 comprising an electrically conductive layer 12 arranged thereon is arranged, which is patterned such that a first electrically conducting portion 12a and a second electrically conducting portion 12b, which is coplanar to the first electrically conducting portion 12a, and a third electrically conducting portion 12c, which is coplanar to the first electrically conducting portion 12a, are generated, the first electrically conducting portion 12a being arranged between the second and the third electrically conducting portions 12b, 12c.

In block 602, at least one electronic device 13 comprising a device terminal side 15 is provided, the electronic device 13 comprising at least one first device terminal pad 14a.

In block 603, the electronic device 13 is mounted on the electrically conductive layer 12 with no bond wire by means of a flip-chip mounting technology so that the device terminal side 15 of the electronic device 13 is arranged opposite the electrically conductive layer 12.

In block 604, at least one first package terminal pad 17a is contacted with the first electrically conducting portion 12a so that the result is a signal path 31 between the first package terminal pad 17a and the first electrically conducting portion 12a and the first device terminal pad 14a, wherein the electronic device 13 is electrically contactable from that side $11_1$ of the foil substrate 11 facing the electronic device 13 by means of the first package terminal pad 17a, and wherein the foil substrate 11 comprises a first foil portion $A_1$ where the first package terminal pad 17a is located, and wherein the foil substrate 11 comprises a second foil portion $A_2$ where the electronic device 13 is located, the first foil portion $A_1$ and the second foil portion $A_2$ extending along a common foil plane E.

In block 605, a casting compound 19 is applied between the first foil portion $A_1$ and the second foil portion $A_2$ so that the casting compound 19 encloses the first package terminal pad 17a and covers the at least one electronic device 13 and divides same from the environment.

In block 606, in the step of patterning the electrically conductive layer 12, the first electrically conducting portion 12a and the second and third electrically conducting portions 12b, 12c are dimensioned such that the first electrically conducting portion 12a is implemented to be a signal-guiding waveguide for high-frequency signals, and the second electrically conducting portion 12b, which is coplanar to the first electrically conducting portion 12a, and the third electrically conducting portion 12c, which is coplanar to the first electrically conducting portion 12a, are each implemented to be waveguides and form an equipotential surface.

Advantageously, this method can be executed as a roll-to-roll method, wherein the foil substrate 11 is wound onto a roll, unwound and equipped and the finished foil-based package 10, after being equipped, is wound again to form a roll.

The flexible foil-based package 10 described here exhibits numerous advantages over conventional, in particular rigid, package forms.

The foil-based package 10 is flexible in that the foil-based package 10 is bendable with no destruction being caused, and in particular with no damage to the electronic device 13, wherein a bending radius $R_B$ is greater by at least 100 times than a thickness $D_P$ of the foil-based package 10. All in all, the ultra-thin flex-foil package 10 allows moderate bending since ultra-thin electronic devices 13, like ultra-thin semiconductor chips having a thickness of approximately 50 μm, for example, can resist such bending without breaking.

Using the ultra-thin flex-foil package, an overall height in the range of, for example, 100 μm to 200 μm can be achieved, i.e. the thickness $D_P$ of the foil-based package 10 may be between 100 μm and 200 μm. Due to the largely minimized layer sequence of the overall arrangement, the minimum value mentioned for the package overall height can be achieved using this foil package 10.

The electronic device 13 (chip) can be integrated between the foil substrate 11 and an embedding layer 19 (casting compound) so that environmental influences act on the chip 13 in an only strongly reduced manner, on the one hand, and, on the other hand, with functionally moderate bending stress, the mechanical stress acting on the chip 13 is so small that there is no chip breaking.

In a flex-foil package 10, several electronic devices 13, like chips, for example, can be connected among one another within the package 10 by means of conductive traces. At least part of all the device terminal pads 14 (IC pads) may also be connected to external package terminal pads 17a, 17b.

The manufacturing sequence, with the exception of the surface treatment of the I/O pads (package terminal pads 17a, 17b) does not require any chemical process steps on the external surface of the embedding material (casting compound 19), which is of particular advantage when process chemicals containing acids or basic process chemicals would act on the embedding material 19.

For high-frequency signals, the coplanar topology with the ground plane 12b, 12c within an ultra-thin foil package 10 allows an impedance adjusted or matched to the frequency range of the signals, wherein, in contrast to conventional packages, a reduced signal interference can be achieved. In particular, in packages having a large number of I/O pads which, due to their complexity, also have a certain size, the lengths of the signal paths become so large that the so-called lambda/4 length is exceeded. For these cases, the inventive topology offers advantages for signal guiding with high-frequency signal bandwidth.

The foil-based package disclosed here may additionally be realized in the following embodiments, wherein the examples mentioned below may all be combined with the other embodiments of the foil-based package described herein:

In accordance with a first further embodiment, a foil-based package 10 for surface mounting is suggested, the foil-based package 10 comprising at least one foil substrate 11, at least one electronic device 13, and a first electrically conductive layer 12 arranged between the electronic device 13 and the foil substrate 11, the first electrically conductive layer 12 being applied to a side $11_2$ of the foil substrate 11 facing the electronic device 13 and connecting the electronic device 13 in an electrically conducting manner to at least one package terminal pad 17a, 17b guided outside to a package terminal side 16, for surface mounting the foil-based package 10 so that the electronic device 13 is electrically contactable from that side $11_1$ of the foil substrate 11 facing the electronic device 13.

In accordance with a second further embodiment, a foil-based package 10 in accordance with any of the embodiments described herein is suggested, wherein the electronic device 13 is a thin glass or electronic chip comprising a foil material or a semiconductor chip comprising a semiconductor material, or the electronic device 13 is a foil element implemented to provide a sensor function.

In accordance with a third further embodiment, a foil-based package 10 in accordance with any of the embodiments described herein is suggested, wherein the foil substrate 10 comprises at least one of a polyimide layer, a polyethylene naphthalate layer, a polyethylene terephthalate layer and a polycarbonate layer.

In accordance with a fourth further embodiment, a foil-based package 10 in accordance with any of the embodiments described herein is suggested, wherein the electronic device 13 is electrically connected to the first electrically conductive layer 12 by means of an electrically conductive solder connection 22 or by means of an adhesive connection 23 comprising an anisotropically electrically conductive adhesive.

In accordance with a fifth further embodiment, a foil-based package 10 in accordance with any of the embodiments described herein is suggested, wherein the foil-based package 10 comprises an opening 40 which extends completely through the foil substrate 11 to the electronic device 13 so that the electronic device 13 can be brought into contact with an environment, at least in portions, through this opening 40, and wherein the electronic device 13 comprises a sensor portion 41 configured to provide a sensor functionality based on contacting a medium present in the environment, wherein the opening 40 exposes at least the sensor portion 41 so that the sensor portion 41 can be brought into contact with the medium present in the environment through this opening 40.

In accordance with a sixth further embodiment, a foil-based package 10 in accordance with the fifth embodiment is suggested, wherein the sensor portion 41 comprises at least one sensor system for detecting a liquid, a gas or for detecting incident light.

In accordance with a seventh further embodiment, a foil-based package in accordance with the fifth or sixth embodiment is suggested, wherein the sensor portion 41 comprises at least one component from the group of inter-digital capacitor structures, amperometric electrodes, resistance meanders, light-sensitive and/or humidity-sensitive and/or gas-sensitive and/or pH-sensitive layers and/or bioanalytical layers.

In accordance with an eighth further embodiment, a foil-based package 10 in accordance with any of the fifth to seventh embodiments is suggested, wherein the opening 40 extends perpendicularly to the foil plane E through the foil substrate 11.

In accordance with a ninth further embodiment, a foil-based package 10 in accordance with any of the fifth to eighth embodiments is suggested, wherein the opening 40 is arranged on a side of the foil-based package 10 which is opposite the package terminal side 16.

In accordance with a tenth further embodiment, a foil-based package 10 in accordance with any of the fifth to ninth embodiments is suggested, wherein a material layer 45 is arranged at lateral side walls 44 of the opening 40 extending through the foil substrate 11.

In accordance with an eleventh further embodiment, a foil-based package 10 in accordance with any of the fifth to tenth embodiments is suggested, wherein the opening 40 is sealed by means of a transparent material.

In accordance with a twelfth further embodiment, a foil-base package 10 in accordance with any of the fifth to eleventh embodiments is suggested, wherein the opening 40 is arranged within the footprint of the electronic device 13. The outer contours of the electronic device 13, which can exemplarily be recognized in a top view, are referred to as footprint.

In accordance with a thirteenth further embodiment, a foil-based package 10 in accordance with any of the embodiments described herein is suggested, wherein the foil substrate 11 comprises at least four corners and the through contacting 62 is arranged in the region of at least one of the four corners.

In accordance with a fourteenth further embodiment, a foil-based package 10 in accordance with any of the embodiments described herein is suggested, wherein the overall length of the first electrically conducting portion 12a is more than of a high-frequency signal which is transferrable by means of the signal-guiding first electrically conducting portion 12a.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A foil-based package comprising:
at least one foil substrate comprising an electrically conductive layer arranged thereon which is patterned to provide a first electrically conducting portion and a second electrically conducting portion, which is coplanar to the first electrically conducting portion, and a third electrically conducting portion, which is coplanar to the first electrically conducting portion, the first electrically conducting portion being arranged between the second and third electrically conducting portions,
at least one electronic device comprising a device terminal side which comprises at least a first device terminal pad,
wherein the at least one electronic device is mounted on the electrically conductive layer with no bond wire in flip-chip mounting technology so that the device terminal side of the electronic device is facing the electrically conductive layer,
a plurality of package terminal pads being arranged on a package terminal side of the foil-based package and being spaced apart laterally from the electronic device, wherein the plurality of package terminal pads are for electrically contacting the foil-based package,
wherein at least a first package terminal pad is in contact with the first electrically conducting portion so that a signal path is provided between the first package terminal pad and the first electrically conducting portion and the first device terminal pad,
wherein the electronic device is electrically contactable from a side of the foil substrate that faces the electronic device by means of the first package terminal pad,
wherein the foil substrate comprises a first foil portion where the first package terminal pad is located, and wherein the foil substrate comprises a second foil portion where the electronic device is located, the first foil portion and the second foil portion extending along a common foil plane, and
a casting compound arranged between the first foil portion and the second foil portion, wherein the casting compound encloses the plurality of package terminal pads and covers the at least one electronic device in order to separate the electronic device from the environment,
wherein the first electrically conducting portion is configured as a signal carrying waveguide for high-frequency signals, and wherein the second electrically conducting portion, which is coplanar to the first electrically conducting portion, and the third electrically conducting portion, which is coplanar to the first electrically conducting portion, both form an equipotential surface, and
wherein the foil-based package comprises an opening extending completely through the foil substrate to the electronic device so that the electronic device can be brought into contact with an environment through this opening, at least in portions.

2. The foil-based package in accordance with claim 1, wherein the foil substrate comprises a foil layer thickness $D_F$ of less than 130 µm, and/or
wherein the electrically conductive layer comprises a layer thickness $D_L$ of less than 20 µm, and/or
wherein the electronic device comprises an element thickness $D_C$ of less than 60 µm, and/or
wherein the foil-based package comprises an overall thickness $D_P$ of less than 300 µm.

3. The foil-based package in accordance with claim 1, wherein the first electrically conducting portion is at a first electrical potential, and wherein the second electrically conducting portion and the third electrically conducting portion are at a common second electrical potential which differs from the first electrical potential.

4. The foil-based package in accordance with claim 1, wherein the electrically conductive layer is planar and arranged at a side of the foil substrate that faces the electronic device, and
wherein the electrically conductive layer forms a ground-signal-ground configuration from the electrically conducting portions, wherein the second and third electrically conducting portions form a ground equipotential surface that is coplanar to the signal carrying first electrically conducting portion.

5. The foil-based package in accordance with claim 1, wherein the first electrically conducting portion is electrically insulated from each of the second electrically conducting portion and the third electrically conducting portion.

6. The foil-based package in accordance with claim 1, wherein the signal carrying first electrically conducting portion is dimensioned such that the result is wave impedance matching for high-frequency signals in the range of 500 MHz or more.

7. The foil-based package in accordance with claim 1, wherein a barrier coating for protection against humidity or electromagnetic radiation is arranged on a side of the foil substrate facing away from the electronic device.

8. The foil-based package in accordance with claim 1, wherein an electrically conductive coating is arranged on a side of the foil substrate facing away from the electronic device, said electrically conductive coating providing a ground equipotential surface.

9. The foil-based package in accordance with claim 8, wherein the electrically conductive coating is connected to at least one grounded portion of the electrically conductive layer either capacitively or electrically through the foil substrate by means of a through contacting.

10. The foil-based package in accordance with claim 1, wherein the first package terminal pad comprises a terminal area facing away from the foil substrate, the first package terminal pad extending from the electrically conductive layer, in a direction perpendicular to the foil plane, across a structural height of the electronic device, the result being a difference in height ΔH between the electronic device and the terminal area of the first package terminal pad, and wherein the casting compound is arranged between the electronic device and the terminal area of the first package terminal pad.

11. The foil-based package in accordance with claim 1, wherein the electronic device comprises a sensor portion configured to provide a sensor functionality based on contacting to a medium present in the environment, wherein the opening exposes at least the sensor portion so that the sensor portion can be brought into contact with the medium present in the environment through this opening.

12. The foil-based package in accordance with claim 1, wherein the opening is arranged on a side of the foil-based package opposite the package terminal side.

13. The foil-based package in accordance with claim 1, the foil-based package being flexible so that the foil-based package is bendable with no destruction caused and, in particular, with no damage to the electronic device, wherein a bending radius $R_B$ is greater than a thickness of the foil-based package by at least 100 times.

14. The foil-based package in accordance with claim 1, wherein the foil-based package is implemented as a Quad Flat No Leads (QFN) package or as a Surface Mount Device (SMD) package.

15. A foil-based package comprising:
at least one foil substrate comprising an electrically conductive layer arranged thereon which is patterned to provide a first electrically conducting portion and a second electrically conducting portion, which is coplanar to the first electrically conducting portion, and a third electrically conducting portion, which is coplanar to the first electrically conducting portion, the first electrically conducting portion being arranged between the second and third electrically conducting portions,
at least one electronic device comprising a device terminal side which comprises at least a first device terminal pad,
wherein the at least one electronic device is mounted on the electrically conductive layer with no bond wire in flip-chip mounting technology so that the device terminal side of the electronic device is facing the electrically conductive layer,
a plurality of package terminal pads being arranged on a package terminal side of the foil-based package and being spaced apart laterally from the electronic device, wherein the plurality of package terminal pads are for electrically contacting the foil-based package,
wherein at least a first package terminal pad is in contact with the first electrically conducting portion so that a signal path is provided between the first package terminal pad and the first electrically conducting portion and the first device terminal pad,
wherein the electronic device is electrically contactable from a side of the foil substrate that faces the electronic device by means of the first package terminal pad,
wherein the foil substrate comprises a first foil portion where the first package terminal pad is located, and wherein the foil substrate comprises a second foil portion where the electronic device is located, the first foil portion and the second foil portion extending along a common foil plane, and
a casting compound arranged between the first foil portion and the second foil portion, wherein the casting compound encloses the plurality of package terminal pads and covers the at least one electronic device in order to separate the electronic device from the environment,
wherein the first electrically conducting portion is configured as a signal carrying waveguide for high-frequency signals, and wherein the second electrically conducting portion, which is coplanar to the first electrically conducting portion, and the third electrically conducting portion, which is coplanar to the first electrically conducting portion, both form an equipotential surface, and
wherein the electrically conductive layer is additionally patterned to provide a fourth electrically conducting portion, which is coplanar to the first electrically conducting portion, wherein the fourth electrically conducting portion, as a signal carrying waveguide, is connected to a second device terminal pad and a second package terminal pad, and wherein, despite a different spacing between the first and second package terminal pads relative to the electronic device, a geometrical length of the first electrically conducting portion and a geometrical length of the fourth electrically conducting portion are equal due to a different shaping.

* * * * *